(12) United States Patent
Mohrdiek et al.

(10) Patent No.: US 8,199,784 B2
(45) Date of Patent: Jun. 12, 2012

(54) LASER LIGHT SOURCE AND METHOD OF OPERATING THE SAME

(75) Inventors: Stefan Mohrdiek, Bach (CH); Joerg Troger, Raron (CH); Nicolai Matuschek, Zurich (CH)

(73) Assignee: Oclaro Technology Limited, Northamptonshire (GB)

(*) Notice: Subject to any disclaimer, the term of this patent is extended or adjusted under 35 U.S.C. 154(b) by 217 days.

(21) Appl. No.: 12/248,984

(22) Filed: Oct. 10, 2008

(65) Prior Publication Data

US 2009/0097511 A1 Apr. 16, 2009

Related U.S. Application Data

(60) Provisional application No. 60/979,985, filed on Oct. 15, 2007.

(51) Int. Cl.
*H01S 3/098* (2006.01)
*H01S 3/13* (2006.01)

(52) U.S. Cl. ............... 372/18; 372/19; 372/30

(58) Field of Classification Search ............ 372/18, 372/19, 30, 99, 102
See application file for complete search history.

(56) References Cited

U.S. PATENT DOCUMENTS

| | | | |
|---|---|---|---|
| 5,828,477 A | 10/1998 | Nilsson et al. | |
| 5,870,417 A | 2/1999 | Verdiell et al. | |
| 6,041,072 A | 3/2000 | Ventrudo et al. | |
| 6,215,809 B1 | 4/2001 | Ziari et al. | |
| 7,088,746 B2 * | 8/2006 | Hashimoto et al. | 372/19 |
| 7,099,361 B2 | 8/2006 | Matuschek et al. | |
| 2002/0163948 A1 | 11/2002 | Yoshida et al. | |

FOREIGN PATENT DOCUMENTS

| | | |
|---|---|---|
| EP | 0468826 | 1/1992 |
| EP | 0812040 * | 12/1997 |
| EP | 1418653 | 5/2004 |

OTHER PUBLICATIONS

Hashizume et al., "Mode Hopping Control and Lasing Wavelength Stabilization of Fiber Grating Lasers", Furukawa Review, No. 20., 2001.
Cassidy et al., "Investigation of Partially Coherent Interaction in Fiber Bragg Grating Stabilized 980-nm Pump Modules", IEEE Journal of Quantum Electronics, vol. 40, No. 6, Jun. 1, 2004.
Brinkmeyer et al., "Fibre Bragg Reflector for Mode Selection and Line-Narrowing of Injection Lasers", Electronics Letters, vol. 22, No. 3, Jan. 30, 1986.
International Search Report and Written Opinion for Appln. No. PCT/EP2008/008735, mailed Nov. 19, 2009.

* cited by examiner

*Primary Examiner* — Armando Rodriguez
(74) *Attorney, Agent, or Firm* — Patterson & Sheridan, L.L.P.

(57) ABSTRACT

A laser light source comprises a semiconductor laser adapted for pulsed operation, a partially transmitting wavelength selective light reflector. The semiconductor laser comprises a front facet and a back facet. The front facet and the back facet define an internal laser cavity. The internal laser cavity comprises a laser active medium. The partially transmitting wavelength selective light reflector has a peak reflectivity within a gain bandwidth of said laser active medium. The wavelength selective light reflector and the back facet define an external laser cavity. A roundtrip time of light in the external laser cavity is about 20 nanoseconds or less. A full width half maximum bandwidth of the wavelength selective light reflector is adapted to accommodate at least 12 longitudinal modes of the internal laser cavity and at least 250 longitudinal modes of the external laser cavity.

11 Claims, 6 Drawing Sheets

LASER LIGHT SOURCE AND METHOD OF OPERATING THE SAME

This application claims priority under 35 USC §119(e) to U.S. Provisional Application No. 60/979,985, filed Oct. 15, 2007. The entire disclosure of the application is hereby incorporated herein by reference.

FIELD OF THE PRESENT INVENTION

The present invention generally relates to laser light sources, more particular to laser light sources comprising a semiconductor laser and/or an optical fiber amplifier, and to laser light sources which may be used in laser machining processes such as laser welding, laser ablation, laser annealing, laser sintering, laser printing, laser scribing, laser marking, laser drilling and/or laser patterning, as well as in medical applications, for example in surgery and diagnostic imaging.

DESCRIPTION OF THE RELATED ART

In modern manufacturing technology, laser machining processes such as laser marking, laser welding, and laser cutting play an important role. In these applications, laser radiation generated by a laser light source is made to interact with at least one workpiece to machine the at least one workpiece. In laser marking, a laser beam can be directed to a workpiece comprising a metal, a plastic or another material to apply text, logos and designs on the workpiece. In laser marking applications a pulsed laser source can be used. In laser welding, the laser radiation may be used to heat two or more workpieces for causing coalescence of the workpieces. In laser cutting, the laser beam can be focused on the workpiece to melt, burn and/or vaporize a portion of the workpiece exposed to the laser radiation. Thus, portions of the workpiece can be removed, and/or an incision can be made in the workpiece. In addition to laser marking, laser welding and laser cutting, laser radiation can be used for laser cladding and micromachining applications, and in medical applications such as optical coherence tomography, microsurgery, and skin resurfacing.

In the state of the art, it has been proposed to use laser radiation sources comprising an optical fiber amplifier for laser machining applications. An optical fiber amplifier according to the state of the art comprises an optical fiber comprising a dopant, for example erbium or ytterbium. Light from a pump light source (seed light source) can be supplied to the doped optical fiber. A wavelength of the pump light source may be adapted to an absorption wavelength of the dopants in the optical fiber such that the dopants absorb the light from the pump light source. The absorption of the light brings the dopants into a metastable excited state. If light from a seed light source having a photon energy corresponding to an energy difference between the excited state and a dopant state having a lower energy than the excited state is supplied to the optical fiber, the light from the seed light source can be amplified by stimulated emission. The seed light source may be operated in a pulsed mode. In examples of methods according to the state of the art wherein the seed light source comprises a semiconductor laser, this can be done by applying a pulsed electric current to the semiconductor laser. Light pulses from the seed light source may then be amplified in the fiber amplifier. Thus, an average output power of the optical fiber amplifier of several watts to tens of watts, and peak powers of several hundreds of watts to kilowatts can be obtained.

A problem of seeded optical fiber amplifiers according to the state of the art is that, with high spectral power densities, undesirable nonlinear optical effects such as stimulated Brillouin scattering may be created in the optical fiber amplifier and/or in other optical fibers provided in the laser radiation source or connected thereto.

Stimulated Brillouin scattering in the optical fiber amplifier and/or another optical fiber provided in the laser radiation source or connected thereto may cause light generation in the reverse direction, i.e., in the direction towards the semiconductor laser. This may reduce the power output of the optical fiber amplifier by up to 90% and/or can cause severe damage to amplifier components, including semiconductor seed and pump lasers.

It is an object of the present invention to provide laser light sources and methods wherein the above-described problems may substantially be avoided, or at least reduced.

SUMMARY OF INVENTION

According to an illustrative example, a laser light source comprises a semiconductor laser adapted for pulsed operation and a partially transmitting wavelength selective light reflector. The semiconductor laser comprises a front reflective element and a back reflective element. The front reflective element and the back reflective element define an internal laser cavity. The internal laser cavity comprises a laser active medium. The partially transmitting wavelength selective light reflector has a peak reflectivity within a gain bandwidth of said laser active medium. The wavelength selective light reflector and the back reflective element define an external laser cavity. A roundtrip time of light in the external laser cavity is about 20 nanoseconds or less. A full width half maximum bandwidth of the wavelength selective light reflector is adapted to accommodate at least 5 longitudinal modes of the internal laser cavity and at least 20 longitudinal modes of the external laser cavity.

According to another illustrative example, a laser light source comprises a semiconductor laser adapted for pulsed operation, a partially transmitting wavelength selective light reflector and an optical fiber amplifier. The semiconductor laser comprises a front reflective element and a back reflective element. The front reflective element and the back reflective element define an internal laser cavity. The internal laser cavity comprises a laser active medium. The wavelength-selective light reflector has a peak reflectivity within a gain bandwidth of the laser active medium. The wavelength-selective light reflector and the back reflective element define an external laser cavity. The optical fiber amplifier is arranged to receive light transmitted by the wavelength-selective light reflector. The optical fiber amplifier has a build-up time for a nonlinear optical effect. The external laser cavity is configured to provide a roundtrip time of light in the external laser cavity which is shorter than the build-up time of the nonlinear optical effect. A full width half maximum bandwidth of the wavelength selective light reflector is adapted to accommodate at least 5 longitudinal modes of the internal laser cavity and at least 20 longitudinal modes of the external laser cavity.

According to yet another illustrative example, a method comprises determining a build-up time of a nonlinear optical effect in a first optical fiber. A semiconductor laser comprising a front reflective element and a back reflective element is provided. The front reflective element and the back reflective element define an internal laser cavity. The internal laser cavity comprises a laser active medium. A partially transmitting wavelength selective light reflector having a peak reflectivity within a gain bandwidth of the laser active medium is provided. The wavelength selective light reflector is arranged to form an external laser cavity defined by the wavelength selective light reflector and the back reflective element of the semiconductor laser. A time for locking of a spectrum of light emitted by the semiconductor laser to a bandwidth of the wavelength selective light reflector upon supplying an electric current to the semiconductor laser is determined. A length of an optical path of light in the external laser resonator is set up to adjust the time for locking to a value smaller than the build-up time for the nonlinear optical effect. Light transmitted by the wavelength selective light reflector is supplied to the first optical fiber.

According to yet another illustrative example, a method comprises providing a semiconductor laser comprising a front reflective element and a back reflective element. The front reflective element and the back reflective element define an internal laser cavity. The internal laser cavity comprises a laser active medium. A partially transmitting wavelength selective light reflector having a peak reflectivity within a gain bandwidth of the laser active medium is provided. The wavelength selective light reflector and the back reflective element define an external laser cavity. A duration of a wavelength chirp of light transmitted by the wavelength selective light reflector upon supplying an electric current to the semiconductor laser is determined. A pulsed electric current is supplied to the semiconductor laser. A pulse time of the pulsed electric current is selected based on at least one of the duration of the wavelength chirp and a build-up time of a nonlinear optical effect in an optical fiber receiving light transmitted by the wavelength selective light reflector In examples of laser radiation sources according to the state of the art wherein the seed light source comprises a semiconductor laser, the semiconductor laser may emit laser radiation having a relatively high intensity within one or more narrow bands of wavelengths corresponding to longitudinal modes of the semiconductor laser. Thus, a relatively high spectral density may be obtained within a stimulated Brillouin scattering gain bandwidth, which may increase the likelihood of reaching the threshold for onset of stimulated Brillouin scattering.

Contrary thereto, laser light sources and methods according to the present subject matter allow to reduce the spectral density within the stimulated Brillouin scattering gain bandwidth and/or may limit a duration of periods of time wherein relatively high spectral densities occur to less than the build-up time of stimulated Brillouin scattering. Thus, the likelihood of stimulated Brillouin scattering and/or other nonlinear effects occurring may be reduced.

BRIEF DESCRIPTION OF THE DRAWINGS

Further advantages, objects and embodiments of the present subject matter are defined in the appended claims and will become more apparent with the following detailed description when taken with reference to the accompanying drawings, in which:

DETAILED DESCRIPTION OF THE INVENTION

While the present subject matter is described with reference to the embodiments as illustrated in the following detailed description as well as in the drawings, it should be understood that the following detailed description as well as the drawings are not intended to limit the present invention to the particular embodiments disclosed, but rather the described embodiments merely exemplify the various aspects of the present subject matter, the scope of which is defined by the appended claims.

According to one embodiment, a laser light source comprises a semiconductor laser adapted for pulsed operation. For pulsed operation of the semiconductor laser, a pulsed electric current may be supplied to the semiconductor laser. An output power of the semiconductor laser during the pulses may, in some embodiments, be relatively high. Thus, the optical fiber amplifier may be driven without a pre-amplification stage, or a number of pre-amplification stages used may be reduced.

In some embodiments, the semiconductor laser may comprise a front facet and a back facet defining an internal laser cavity. The present subject matter, however, is not restricted to embodiments wherein the internal laser cavity is defined by facets of the semiconductor laser. In other embodiments, the internal laser cavity may be defined by a front reflective element other than the front facet and a back reflective element other than the back facet. For example, the front reflective element and the back reflective element may comprise fiber Bragg gratings formed in an optical fiber connected to the semiconductor laser. In such embodiments, the front facet and the back facet may comprise an anti-reflective coating such that a reflection of light at the front facet and the back facet may substantially be avoided. In still further embodiment, the internal laser cavity may be defined by one of the front facet and the back facet of the semiconductor laser and one reflective element other than a facet of the semiconductor laser. In the internal laser cavity, a laser active medium may be provided in form of a p-n-transition wherein electron-hole pairs are created if an electric current is supplied to the semiconductor laser. Reflectivities of the front reflective element and the back reflective element may be adapted such that the internal laser cavity forms an optical resonator providing sufficient optical feedback to the laser active medium for inducing a lasing operation of the semiconductor laser. Hence, the semiconductor laser may be capable of standalone operation in the absence of further optical components.

The laser light source may further comprise a partially transmitting wavelength selective light reflector having a peak reflectivity within a gain bandwidth of the laser active medium. In some embodiments, the peak reflectivity of the wavelength selective light reflector can be within the gain bandwidth of the laser active medium. The partially transmitting wavelength selective light reflector is arranged such that the back reflective element of the semiconductor laser and the wavelength selective light reflector define an external laser cavity. A full width half maximum bandwidth of the wavelength selective light reflector can be adapted to accommodate at least 12 longitudinal modes of the internal laser cavity and at least 250 longitudinal modes of the external laser cavity.

Light which is emitted by the semiconductor laser can be reflected by the wavelength selective light reflector to the semiconductor laser, and may enter the laser active medium. The reflected light may interact with the laser active medium, such that the reflected light may have an influence on the generation of light by the semiconductor laser.

The influence of the reflected light on the generation of light by the semiconductor laser may be two-fold. First, since the peak reflectivity of the wavelength selective light reflector is within the gain bandwidth of the laser active medium, the reflected light may be amplified by stimulated emission of light in the laser active medium. This may lead to an increase of the net gain of the laser light source for those wavelengths which are reflected by the wavelength-selective light reflector. Therefore, a spectrum emitted by the laser light source may collapse to a spectrum comprising wavelengths which are reflected by the wavelength selective light reflector. In the following, this effect will be denoted as "locking".

Second, in the internal laser cavity, the reflected light may act as a source of noise, which may reduce a likelihood of operation of the semiconductor laser in a single mode regime, such that the semiconductor laser operates in a multimode regime. Thus, the spectrum of light emitted by the laser light source, comprising a compound cavity formed by the internal laser cavity and the external laser cavity, may comprise a plurality of wavelengths which are influenced by the modes of the internal laser cavity and the modes of the external laser cavity within the bandwidth of the wavelength selective light reflector. Hence, an occurrence of high spectral densities at one or a couple of peak wavelengths may be reduced or substantially avoided.

Nonlinear optical effects may occur in optical elements receiving a high density of light within a relatively narrow range of wavelengths which is denoted as "gain bandwidth" of the nonlinear optical effect. Hence, stimulated Brillouin scattering may occur in optical elements if a density of light within a stimulated Brillouin scattering gain bandwidth exceeds a threshold value.

The threshold value for onset of nonlinear optical effects such as stimulated Brillouin scattering may depend on the spectral density of the light, the time the incident light is allowed to interact with the optical element, and on various properties of the optical element. In optical elements comprising an optical fiber, the threshold for onset of stimulated Brillouin scattering may depend, e.g., on the material of the fiber and the thickness of the fiber.

In some embodiments, the light transmitted by the wavelength selective light reflector can be supplied to an optical fiber, for example for seeding an optical fiber amplifier provided in the optical fiber. In the optical fiber, stimulated Brillouin scattering may occur. In particular, in an optical fiber amplifier, the threshold value for the density of light at which stimulated Brillouin scattering may occur can be relatively easily reached due to the amplification of light in the fiber amplifier. Hence, stimulated Brillouin scattering may occur even at a relatively short length of the optical fiber amplifier which may, in some embodiments, be about one meter. The stimulated Brillouin scattering may lead to a generation of light in the reverse direction, i.e., in the direction towards the semiconductor laser, which may reduce the output power of the optical fiber amplifier by up to 90% and can cause damages of the laser light source.

Nonlinear optical effects such as stimulated Brillouin scattering may have a characteristic build-up time. The nonlinear optical effect may occur if the spectral density of light within the gain bandwidth of the nonlinear optical effect exceeds the threshold value for a period of time longer than the build-up time. In case of stimulated Brillouin scattering, the build-up time may be influenced by the lifetime of phonons. In some embodiments wherein the optical element comprises an ytterbium-doped fiber amplifier, and the semiconductor laser is configured to emit a peak power of about 1 Watt during a pulse, the build-up time for stimulated Brillouin scattering can be about 10 nanoseconds or more.

The external laser cavity may be configured such that a time which is required until the spectrum of light emitted by the semiconductor laser is locked to the bandwidth of the wavelength selective light reflector is shorter than the build-up time of the nonlinear optical effect. This may allow reducing a likelihood that the nonlinear optical effect will occur.

The time for locking depends on the roundtrip time of light in the external laser cavity. Light emitted by the semiconductor laser and reflected back to the semiconductor laser by the wavelength selective light reflector may arrive at the laser active medium and interact with the laser active medium after one roundtrip time of the external laser cavity has passed since the beginning of a pulse. Therefore, locking and a multimode operation of the semiconductor laser may occur at a characteristic period of time after the beginning of a pulse, wherein the characteristic period of time may be controlled by varying the roundtrip time of the external laser cavity, for example by varying the distance between the semiconductor laser and the wavelength selective light reflector.

In some embodiments, the roundtrip time may have a value of about 20 nanoseconds or less, of about 10 nanoseconds or less, of about 5 nanoseconds or less or of about 1 nanosecond or less. The distance between the semiconductor laser and the wavelength selective light reflector may be about 2 meters or less, about 1 meter or less, about 50 centimeters or less or about 10 centimeters or less.

If an electric current pulse is supplied to the semiconductor laser, a wavelength chirp may occur. During the chirp, the center wavelength of the spectrum of light emitted by the laser light source may increase. In case the center wavelength of the spectrum of light emitted by the laser light source shifts through the gain bandwidth of stimulated Brillouin scattering at a relatively fast rate such that the optical element receiving radiation emitted by the laser light source is exposed to a light density greater than the threshold value of stimulated Brillouin scattering for a period of time shorter than the build-up time of stimulated Brillouin scattering, an occurrence of stimulated Brillouin scattering may substantially be avoided.

In one embodiment, the gain bandwidth of stimulated Brillouin scattering can be about 100 megahertz and the build-up time of stimulated Brillouin scattering can be about 10 nanoseconds. In such embodiments, a likelihood of stimulated Brillouin scattering occurring may be reduced if the center frequency of the spectrum of light changes at about 100 megahertz per 10 nanoseconds or more, corresponding to a rate at which the center wavelength changes of about 0.4 picometers per 10 nanoseconds or more if the center wavelength is approximately 1060 nanometers.

The pulse time may be determined based on a duration of the wavelength chirp and a build-up time of a nonlinear effect such as, for example, stimulated Brillouin scattering, in an optical element receiving radiation from the laser light source. In some embodiments, the pulse time may be approximately equal to or less than a sum of the effective duration of the chirp and the build-up time of the nonlinear optical effect. Since the occurrence of the nonlinear optical effect may require an exposure of the optical element to radiation in a narrow wavelength range for a period of time longer than the build-up time, determining the pulse time in this manner may help to avoid or reduce the nonlinear optical effect.

Further embodiments will be described with respect to FIGS. 1-7.

Figure 1:
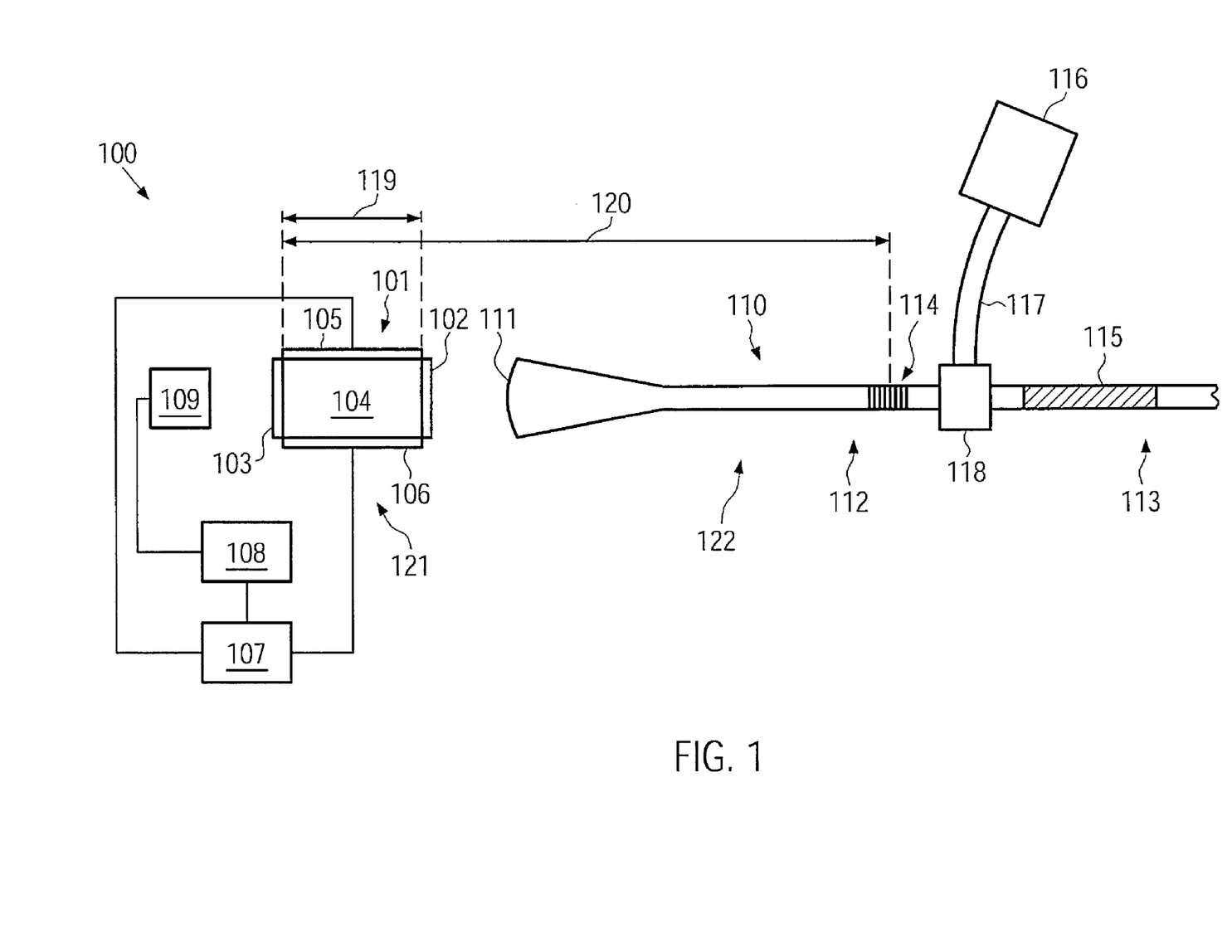
FIG. 1 shows a schematic drawing of a laser light source according to an embodiment.

FIG. 1 shows a schematic drawing of a laser light source 100 according to an embodiment. The laser light source 100 comprises a semiconductor laser 101. The semiconductor laser 101 may comprise a semiconductor laser diode adapted for pulsed operation.

The semiconductor laser 101 comprises a laser active medium 104, a first electrode 105 and a second electrode 106. By applying an electric current between the first electrode 105 and the second electrode 106, a population inversion may be created in the laser active medium such that light may be amplified by stimulated emission of light in the laser active medium 104. In some embodiments, the laser active medium 104 can comprise a quantum well structure based on an InGaAlAs/GaAs material system well known to persons skilled in the art of laser diodes. In some embodiments, the laser active medium 104 can be adapted such that light in a wavelength range centered at a wavelength of about 1060 nanometers is amplified. In other embodiments, the laser active medium 104 can be adapted such that light in a wavelength range centered at a wavelength of about 974 nanometers is amplified. As persons skilled in the art know, the range of wavelengths which are amplified in the laser active medium 104 can be controlled by controlling the indium content of the quantum well. The present subject matter, however, is not restricted to the InGaAlAs/GaAs material system or wavelength ranges centered at 974 nm or 1060 nm, respectively. In other embodiments, other material systems and other wavelength ranges may be used.

The semiconductor laser 101 may comprise a front facet 102 defining a front reflective element and a back facet 103 defining a back reflective element. The front facet 102 may be adapted to transmit a portion of light created in the laser active medium 104 and to reflect another portion of the light back into the laser active medium 104. The front facet 102 can be configured to reflect a relatively small fraction of light arriving from the laser active medium 104 back into the laser active medium 104, and to transmit a relatively large fraction of the light. In some embodiments, the front facet can have a reflectivity of about 0.01% or more and/or a reflectivity of about 0.1% or more and/or a reflectivity of about 0.5% or more. In further embodiments, the front facet may have a relatively small reflectivity. In particular, the front facet can have a reflectivity of about 0.01% or less and/or a reflectivity of about 0.1% or less and/or a reflectivity of about 1% or less.

Similar to the front facet 102, the back facet 103 may be configured to reflect light arriving from the active medium 104 back into the active medium 104, wherein the back facet 103 can be configured to reflect a relatively large fraction of the light. In some embodiments, the back facet 103 can have a reflectivity of about 90% or more.

The reflectivity of the front facet 102 and the back facet 103, respectively, of the semiconductor laser 101 can be controlled by coating the front facet 102 and/or the back facet 103 with a material having an index of refraction different from the index of refraction of the laser active medium 104. The reflectivity obtained may depend on the thickness of the coating. If the thickness of the coating is adapted such that light reflected on the side of the coating averted from the laser active medium 104 interferes constructively with light reflected on the side of the coating adjacent to the laser active medium 104, a relatively high reflectivity may be obtained. If the thickness of the coating is adapted such that light reflected on the side of the coating averted from the laser active medium 104 interferes destructively with light reflected on the side of the coating adjacent to the laser active medium 104, a relatively low reflectivity may be obtained.

The front facet 102 and the back facet 103 of the semiconductor laser 101 may define an internal laser cavity 121. The reflectivities of the front facet 102 and the back facet 103 can be adapted such that, under typical conditions of operation of the semiconductor laser 101, losses of the intensity of light in the laser active medium by transmission through the front facet 102 and the back facet 103, and losses caused by other sources, are compensated by amplification in the laser active medium 104. Hence, the semiconductor laser 101 is operable in the absence of other optical components connected thereto.

In some embodiments, the internal laser cavity 121 may be defined by a front reflective element other that the front facet 102 and a back reflective element other than the back facet 103. For example, the front reflective element and/or the back reflective element can be provided in form of fiber Bragg gratings provided in optical fibers connected to the active medium 104, or the laser active medium may be provided between a front mirror and a back mirror defining the front reflective element and the back reflective element, respectively, wherein at least the front mirror may be partially light transmitting. In other embodiments, one of the front reflective element and the back reflective element can be defined by the front facet or the back facet, respectively, and the other of the front reflective element and the back reflective element can be defined by a mirror or a fiber Bragg grating.

The present subject matter is not restricted to embodiments wherein the semiconductor laser 101 comprises an edge-emitting semiconductor laser wherein the electrodes 105, 106 are substantially perpendicular to the front facet 102 and the back facet 103, as shown in FIG. 1. In other embodiments, the semiconductor laser 101 may comprise a vertical cavity surface emitting laser diode.

The laser light source 100 may further comprise a power source 107. The power source 107 can be configured to supply a pulsed electric current to the semiconductor laser 107. The power source 107 may be connected to a control unit 108. The control unit 108 can be adapted to control parameters of the pulsed electric current such as a voltage and an amperage supplied during the pulses as well as a duration of the pulses. Additionally, the power source can be configured to control a shape of the pulses. For example, the power source can be adapted to provide square pulses, trapezoidal pulses and/or sawtooth pulses.

In the vicinity of the back facet 103 of the semiconductor laser 101, a light detector 109 adapted to measure an intensity of light transmitted by the back facet 103 of the semiconductor laser 101 can be provided. In some embodiments, the light detector 109 may comprise a photodiode. The light detector 109 can be connected to the control unit 108. The control unit can be adapted to control the electric current supplied to the semiconductor laser 101 such that a desired intensity of light is obtained.

The laser light source 100 may further comprise at least one optical fiber 110 adapted to receive light emitted by the semiconductor laser 101. The at least one optical fiber 110 can comprise an end having a lens surface 111 located adjacent the semiconductor laser 101. The lens surface can be provided at a thickened end of the at east one optical fiber 110, or may be provided in form of a tip of the at least one optical fiber 110.

This may allow an efficient coupling of light output by the semiconductor laser 101 into the at least one optical fiber 110. In some embodiments, the coupling efficiency of the light output by the semiconductor laser 101 into the optical fiber may be about 50% or more. In further embodiments, the coupling efficiency may have a value in a range from about 60% to about 80% and/or a coupling efficiency of about 65% or more.

The present invention is not restricted to embodiments wherein the at least one optical fiber 110 comprises a lens surface 111 provided on the end of the at least one optical fiber 110. In other embodiments, different means for coupling light emitted by the semiconductor laser 101 into the optical fiber 110 may be used, for example one or more lenses located between the semiconductor laser 101 and the at least one optical fiber 110.

The at least one optical fiber 110 may comprise a first optical fiber 113 and a second optical fiber 112.

In some embodiments, the first optical fiber 113 can comprise an optical fiber amplifier 115 of a type known to persons skilled in the art, for example an ytterbium-doped fiber amplifier 115. The optical fiber amplifier 115 may be pumped by means of light from a pump light source 116 which may, in some embodiments, comprise one or more semiconductor lasers. Light from the pump light source 116 may be supplied to the optical fiber amplifier 116 by means of a third optical fiber 117 and a coupling element 118 of a type known to persons skilled in the art.

As persons skilled in the art know, the optical fiber amplifier 115 when comprising an ytterbium-doped optical fiber may be pumped at two efficient absorption wavelength regions around 920 nanometers and around 980 nanometers. Amplification may take place at a wavelength range from about 970 nanometers to about 1200 nanometers. In particular, the gain in an optical fiber amplifier 115 when comprising an ytterbium-doped optical fiber may be optimized to amplify light having a wavelength of about 1060 nanometers.

The present invention is not restricted to embodiments wherein the optical fiber amplifier 115 comprises an ytterbium-doped optical fiber. In other embodiments, the optical fiber amplifier 115 can comprise an optical fiber doped with other elements, for example erbium, thulium, neodymium, or a combination thereof. In still further embodiments, the first optical fiber 113 does not comprise an optical fiber amplifier. Instead, the first optical fiber 113 can be configured as a light conductor for guiding light created by the laser light source 100 to a remote location. In some embodiments, the first optical fiber 113 and the second optical fiber 112 may comprise portions of a single optical fiber.

The second optical fiber 112 may comprise a fiber with an imposed Bragg grating 114. The fiber Bragg grating 114 comprises a periodic pattern of an alternating index of refraction formed in the second optical fiber 112. As persons skilled in the art know, a periodic pattern of an alternating index of refraction can be formed by irradiating the second optical fiber 112 with ultraviolet radiation. The irradiation with ultraviolet radiation leads to an alteration of the index of refraction of the material of the second optical fiber 112, wherein the index of refraction is altered to a greater extent in those portions of the second optical fiber 112 which receive a high dose of ultraviolet radiation. In some embodiments, the second optical fiber 112 may be doped, for example with germanium, to provide or increase a sensitivity of the second optical fiber 112 for the ultraviolet radiation.

A portion of light traveling along the second optical fiber 112 may be reflected at the locations of alternating index of refraction. Due to the periodicity of the pattern of alternating index of refraction, a moderately large fraction of the light may be reflected if the wavelength of the light is such that light reflected at neighboring locations of alternating index of refraction interferes constructively. Conversely, if the wavelength of the light does not match with the periodicity of the fiber Bragg grating 114, destructive interference may occur between light reflected at different locations of alternating index of refraction such that a relatively low reflectivity is obtained. A wavelength of a peak reflectivity of the fiber Bragg grating 114 and a bandwidth of the fiber Bragg grating 114 can be controlled by varying the pattern of alternating index of refraction. Methods of designing a fiber Bragg grating having a desired peak reflectivity at a desired center wavelength and a desired bandwidth are known to persons skilled in the art.

Hence, the fiber Bragg grating 114 may provide a wavelength-selective light reflector adapted to reflect a desired fraction of light within a predetermined wavelength range and substantially completely transmitting light having a wavelength outside the predetermined wavelength range. In one embodiment, the fiber Bragg grating may have a peak reflectivity in a range from about 1% to about 15%, for example a peak reflectivity of about 2.5%. The fiber Bragg grating may have a full width half maximum bandwidth in a range from about 0.2 nanometers to about 5 nanometers and/or a full width half maximum bandwidth in a range from about 0.5 nanometers to about 5 nanometers, for example a full width half maximum bandwidth of about 2 nanometers as well as a center wavelength of about 1060 nanometers and/or a center wavelength of about 974 nanometers.

Light emitted by the semiconductor laser 101 may be reflected by the fiber Bragg grating 114. The reflected light may travel along the second optical fiber 112, and may be coupled into the semiconductor laser 104 wherein it may interact with the laser active medium 104. In particular, the reflected light may be amplified by stimulated emission of light in the laser active medium 104. After interaction with the laser active medium 104, the light may be reflected at the back facet 103 of the semiconductor laser 101. The reflected light may interact with the laser active medium 104 again. Subsequently, it may leave the internal laser cavity 121 via the front facet 102 to enter the second optical fiber 112, wherein it can be reflected at the fiber Bragg grating 114. Hence, the fiber Bragg grating 114 and the back facet 103 of the semiconductor laser 101 define an external laser cavity 122.

Figure 2:
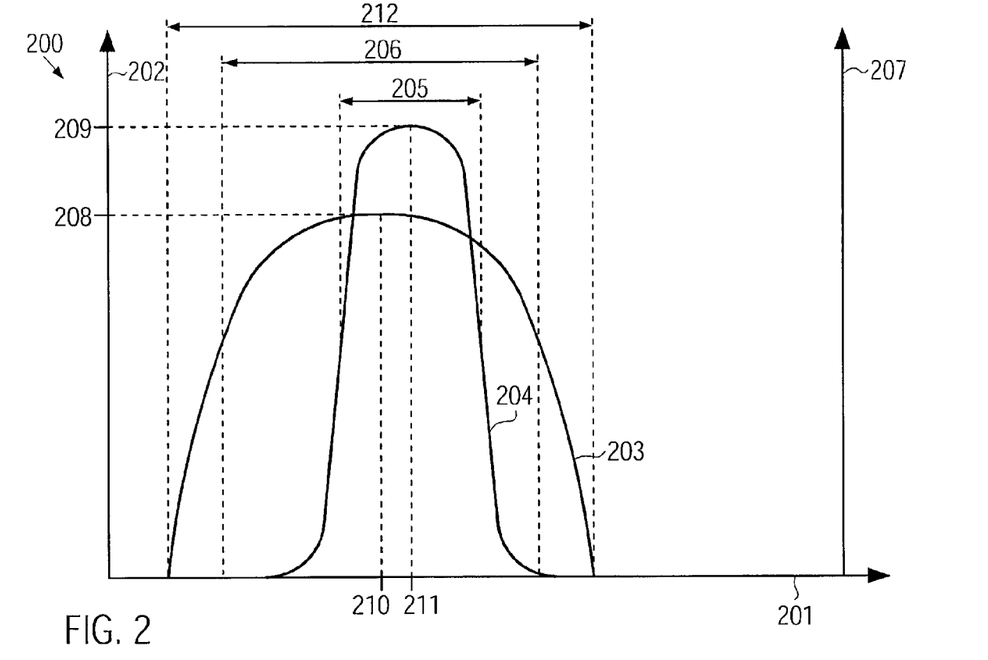
FIG. 2 shows a schematic drawing of a gain of a laser active medium and a reflectivity of a wavelength selective light reflector in an embodiment.

FIG. 2 shows a schematic drawing illustrating a relationship between a gain of the laser active medium 104 and reflectivity of the fiber Bragg grating 114. A coordinate system 200 comprises a horizontal coordinate axis representing a wavelength of light. A first vertical coordinate axis 202 represents a gain of the laser active medium 104, and a second vertical coordinate axis 207 represents a reflectivity of the fiber Bragg grating 114.

A first curve 203 schematically illustrates the dependence of the gain of the laser active medium 104 on the wavelength of light. The gain of the active medium comprises a full width half maximum 206 and a gain bandwidth 212. As persons skilled in the art know, the term "full width half maximum" denotes a wavelength range wherein the gain of the active medium is greater than 50% of a maximum gain 208. The maximum gain 208 can be obtained as a maximum gain wavelength 210, corresponding to a maximum of the curve 203.

In FIG. 2, a second curve 204 schematically illustrates the dependence of the reflectivity of the fiber Bragg grating 114 on the wavelength of light. The reflectivity may comprise a full width half maximum bandwidth 205 comprising a wavelength range wherein the reflectivity is greater than 50% of a maximum reflectivity 209. The maximum reflectivity 209 can be obtained at a maximum reflectivity wavelength 211 corresponding to a maximum of the curve 204.

The maximum reflectivity wavelength 211 of the fiber Bragg grating 214 can be within the gain bandwidth 212 of the laser active medium 104. Hence, a relatively large amplification of light reflected by the fiber Bragg grating 114 may be obtained in the laser active medium 104. This may lead to a particularly efficient locking of the spectrum emitted by the laser light source 100 to the full width half maximum bandwidth 205 of the fiber Bragg grating.

In some embodiments, the peak reflectivity wavelength 211 may be relatively close to the peak gain wavelength 210. In one embodiment, an absolute value of a difference between the peak reflectivity wavelength 211 and the peak gain wavelength may be about 10 nanometers or less. In further embodiments, the peak gain wavelength 210 and the peak reflectivity wavelength 211 can be approximately equal.

The full width half maximum bandwidth 205 of the fiber Bragg grating 114 can be smaller than the gain bandwidth 212 and/or the full width half maximum bandwidth 206 of the gain of the laser active medium 104. This may help to obtain a more efficient mode selectivity by the fiber Bragg grating 114.

The full width half maximum bandwidth 205 of the fiber Bragg grating 114 can accommodate a number of modes of the external laser cavity 122 and a number of modes of the internal laser cavity 121. As persons skilled in the art know, a laser resonator having an optical path of length L may have modes at wavelengths $$\lambda_n = L/(2n) \quad (1)$$

wherein n is an integer number greater than zero. Hence, the spacing between the laser modes is $$\lambda_{n+1} - \lambda_n = \Delta\lambda = \lambda_n/(n+1) \quad (2)$$

Thus, $$\Delta\lambda/\lambda_n \approx (2\lambda_n)/L. \quad (3)$$

A length of an optical path of light in the internal laser cavity 121 formed by the back facet 103 and the front facet 102 is related to a length 119 of the internal laser cavity 121, corresponding to a distance between the back facet 103 and the front facet 102 of the semiconductor laser 101. In some embodiments, the length 119 of the internal laser cavity 119 can be about 3.6 mm. The length of the optical path of light in the external laser cavity 122 is related to a length 120 of the external laser cavity 122, corresponding to a distance between the back facet 103 and the fiber Bragg grating 114. The length of the optical path and, hence, the mode spacing in the internal laser cavity 121 and the external laser cavity 122 may further be influenced by the index of refraction of the laser active medium 104 and the second optical fiber 112. Methods of calculating the mode spacing in the internal laser cavity 121 and the external laser cavity 122 are known to persons skilled in the art. In some embodiments, the laser active medium 104 may have an index of refraction of about 3.74, and the second optical fiber 112 may have an index of refraction of about 1.41.

Since the length 120 of the optical path of light in the external laser cavity 122 is greater than the length 119 of the optical path of light in the internal laser cavity 121, the spacing between neighboring laser modes in the external laser cavity 122 can be smaller than the spacing between neighboring laser modes in the internal laser cavity 121. Therefore, the full width half maximum bandwidth 205 of the fiber Bragg grating 114 may accommodate a number of modes of the external laser cavity 122 which is greater than the number of modes of the internal laser cavity 121 within the full width half maximum bandwidth of the fiber Bragg grating 114. In some embodiments, the fiber Bragg grating 114 can be adapted to accommodate at least 5 longitudinal modes of the internal laser cavity 121 and at least 20 longitudinal modes of the external laser cavity 122 and/or at least 12 longitudinal modes of the internal laser cavity 121 and at least 250 longitudinal modes of the external laser cavity 122. In further embodiments, the full width half maximum bandwidth of the fiber Bragg grating 114 may comprise at least 100 longitudinal modes of the internal laser cavity 121 and at least 2500 longitudinal modes of the external laser cavity 122 and/or at least 50 longitudinal modes of the internal laser cavity 121 and at least 1000 longitudinal modes of the external laser cavity 122.

Figure 3:
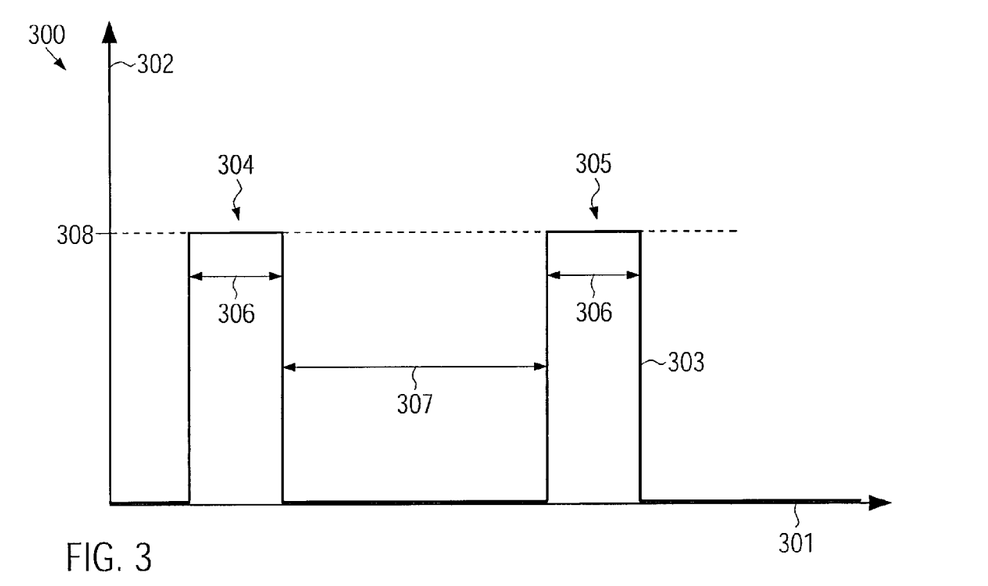
FIG. 3 shows a schematic drawing of an amperage of a current supplied to a semiconductor laser in an embodiment.

As already mentioned above, the power source 107 can be adapted to supply a pulsed electrical current to the semiconductor laser 101. FIG. 3 shows a schematic drawing of an amperage of a current supplied to the semiconductor laser 101 by the power source 107. A coordinate system 300 comprises a horizontal coordinate axis 301 representing time and a vertical coordinate axis 302 representing amperage. A curve 303 illustrates the time dependence of the current supplied to the semiconductor laser 101. The current may comprise a plurality of pulses 304, 305. Each of the pulses 304, 305 may have a pulse time 306, and there may be an off time 307 between subsequent pulses. During the pulses 304, 305, the current may have an amperage 308 being greater than a lasing threshold of the semiconductor laser 101. Between the pulses 304, 305, the amperage may be approximately zero. In other embodiments, a current having an amperage less than the lasing threshold of the semiconductor laser 101 can be supplied between the pulses 304, 305.

The pulse time 306 may have a value in a range from about 3 nanoseconds to about 1 microsecond and/or in a range from about 10 nanoseconds to about 1 microsecond. In further embodiments, the pulse time 306 may have a value in a range from about 10 nanoseconds to about 250 nanoseconds and/or in a range from about 10 nanoseconds to about 500 nanoseconds and/or in a range from about 3 nanoseconds to about 1 microsecond. In further embodiments, the pulse time 206 may have a value of about 100 nanoseconds.

A duty cycle of the pulsed current supplied to the semiconductor laser 101 may be calculated as a ratio between pulse time 306 and a periodic time of the pulsed current, wherein the periodic time is given by the sum of the pulse time 306 and the off time 307.

In some embodiments, the duty cycle may have a value of about 10% or less, for example a value of about 2%.

The amperage 308 of the pulses 304, 305 may have a value in a range from about 0.7 amperes to about 2 amperes. Depending on the conversion efficiency of the semiconductor laser 101, this may lead to a peak power of about 1 Watt or more supplied to the second optical fiber 112 during the pulses 304. Hence, during the pulses 304, 305, the semiconductor laser 101 may output light having a relatively high intensity. In the interval between the pulses 304, 305, the semiconductor laser 101 may emit a relatively low light intensity, or may emit substantially no light at all.

Further properties of the light output by the semiconductor laser 101 during pulsed mode operation will be discussed with reference to FIGS. 4 and 5.

Figure 4:
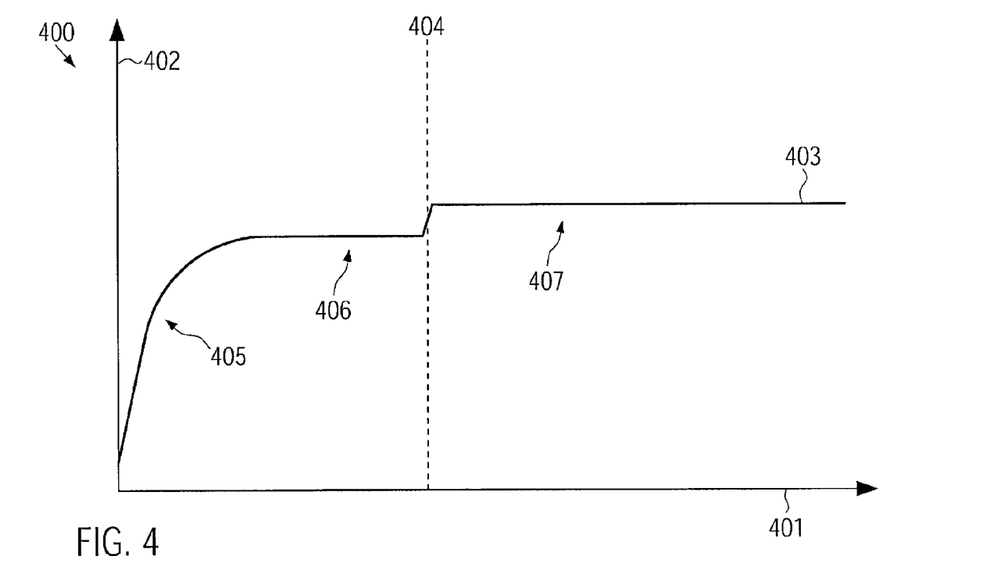
FIG. 4 shows a schematic drawing of a center wavelength of a spectrum of light emitted by a semiconductor laser as a function of time upon supplying an electric current to the semiconductor laser.

FIG. 4 shows a schematic drawing illustrating a time dependence of a center wavelength of a spectrum of light emitted by the semiconductor laser 101 during a current pulse 304, 305 supplied to the semiconductor laser 101 in the absence of the second optical fiber 112 and/or the fiber Bragg grating 114. A coordinate system 400 comprises a horizontal coordinate axis 401 representing time and a vertical coordinate axis 402 representing the center wavelength of the spectrum of light emitted by the semiconductor laser 101.

The center wavelength of the spectrum of light may be determined by supplying the emitted light to a spectrometer of a type known to persons skilled in the art, for example a prism spectrometer or a spectrometer comprising a diffraction grating. A sensor, for example a charge coupled device, may be used to measure the intensity of the emitted light as a function of wavelength in a time-resolved manner. The center wavelength may be determined on the basis of the measured spectra by calculating an average wavelength and/or a wavelength of maximum intensity.

In FIG. 4, a curve 403 illustrates the time-dependence of the center wavelength. At the beginning of a pulse 304, 305, a relatively quick increase of the center wavelength may be obtained, as indicated by reference numeral 405 in FIG. 4. Subsequently, the center wavelength may remain substantially constant, as indicated by reference numeral 406 in FIG. 4., indicating laser operation at only one mode or only a couple of modes of the internal laser cavity 121. At longer pulse durations the laser center wavelength may hop to another mode, as indicated by reference numeral 407 in FIG. 4. The relatively quick increase 405 of the center wavelength 405 may have a duration of about 5 nanoseconds or less. In some embodiment, the duration of the relatively quick increase 405 may correspond to a rise time of the power source 107.

Figure 5:
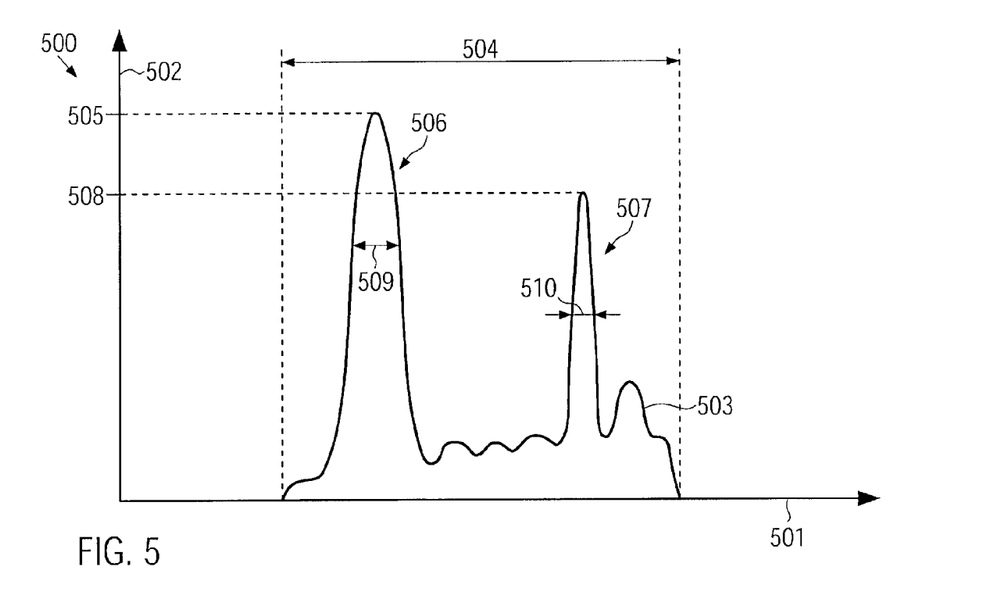
FIG. 5 shows a schematic drawing of a spectrum of light emitted by the semiconductor laser.

FIG. 5 schematically illustrates a spectrum which is obtained at a point of time 404 (FIG. 4) during a pulse 304, 305 when the semiconductor laser 101 is operated in the absence of the second optical fiber 112 and/or the fiber Bragg grating 114. A coordinate system 500 comprises a horizontal coordinate axis 501 and a vertical coordinate axis 502. The horizontal coordinate axis 501 represents a wavelength, and the vertical coordinate axis 502 represents an intensity of light obtained at the respective wavelength. A curve 503 schematically illustrates a spectrum of light emitted by the semiconductor laser 101.

The spectrum 503 may have a relatively large bandwidth 504 of about 6 nanometers or more, and may comprise one or more peaks 506, 507. The peaks 506, 507 may have a relatively large peak intensity, as denoted by reference numerals 505, 508, respectively, and may have a relatively small bandwidth, as denoted by reference numerals 509, 510, respectively. The wavelength of the peaks 506, 507 may correspond to a wavelength of longitudinal modes of the internal laser cavity 121 of the semiconductor laser 101.

If the light output by the semiconductor laser 101 in the absence of the second optical fiber 112 and the fiber Bragg grating 114 were coupled into the optical fiber amplifier 115, the relatively high intensity obtained at the wavelength of the peaks 506, 507 might lead to an occurrence of nonlinear optical effects such as stimulated Brillouin scattering in the optical fiber amplifier 115 and/or after amplification in the optical fiber amplifier 115.

As persons skilled in the art know, in stimulated Brillouin scattering, variations in the electrical field created by a beam of light in an optical medium may create acoustic vibrations in the optical medium via electrostriction. Phonons of the acoustic vibrations may interact with photons of the beam of light, leading to a scattering of the light. Stimulated Brillouin scattering may occur if the optical medium is exposed to a relatively high intensity of light within the stimulated Brillouin scattering gain bandwidth for a period of time which is longer than the build-up time of stimulated Brillouin scattering. Hence, the presence of the peaks 506, 507 and the relatively slow alteration of the center wavelength 403 after the initial increase 405 may increase a likelihood of stimulated Brillouin scattering occurring in the optical fiber amplifier 115 and/or after amplification in the optical fiber amplifier 115.

The build-up time for stimulated Brillouin scattering may depend on material properties of the optical medium, on the spectrum and on the intensity of the light with which the optical medium is irradiated. In an ytterbium-doped optical fiber output coupled to the semiconductor laser 101 as described above, the build-up time for stimulated Brillouin scattering may have a value in a range from about 10 nanoseconds to about 50 nanoseconds. The build-up time for stimulated Brillouin scattering may be determined by means of methods known to persons skilled in the art, for example by measuring a density of light reflected in the first optical fiber 113 and/or a density of light transmitted by the first optical fiber 113 as a function of time. Alternatively, the build-up time for stimulated Brillouin scattering can be calculated theoretically on the basis of material properties of the first optical fiber 113.

The presence of the external laser cavity 122 may reduce a likelihood of stimulated Brillouin scattering occurring, as will be explained in the following.

As already mentioned above, light reflected by the fiber Bragg grating 114, may interact with the laser active medium 104. Thus, a locking of the spectrum of light emitted by the semiconductor laser 101 to the bandwidth of the fiber Bragg grating 114 and a relatively even distribution of the intensity over the bandwidth of the fiber Bragg grating 114 can be obtained.

When light emitted by the semiconductor laser 101 is reflected back into the laser active medium 104 by the fiber Bragg grating 114, the reflected light may arrive at the laser active medium 104 after a period of time corresponding to the roundtrip time of the external laser cavity 122 formed by the back side facet 103 of the semiconductor laser 101 and the fiber Bragg grating 114. Hence, if a pulsed electric current is applied to the semiconductor laser 101, the laser active medium 104 may receive the reflected light at points of time which are later than the time required for the light to move to the fiber Bragg grating 114 and back to the semiconductor laser 101 after the start of a pulse. Hence, the laser active medium 104 may receive reflected light later than one roundtrip time of the external laser cavity 122 after the start of the pulse. Therefore, locking can be obtained at points of time which are later than one roundtrip time of the external laser cavity 122.

Features of the light transmitted through the fiber Bragg grating 114 in the laser light source 100 will be discussed with reference to FIGS. 6, 7a and 7b.

Figure 6:
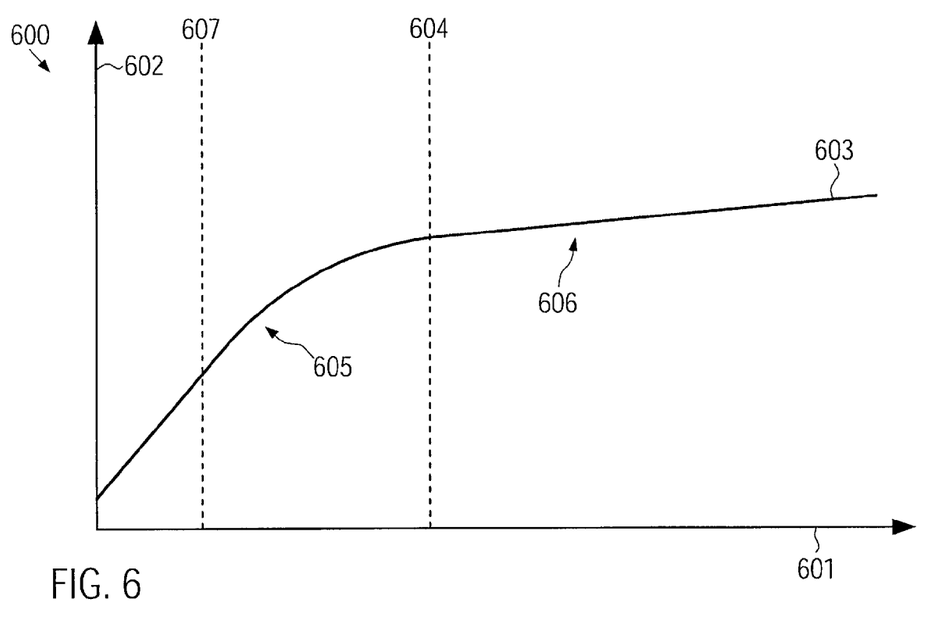
FIG. 6 shows a schematic drawing of a center wavelength of a spectrum of light transmitted through a partially transmitting wavelength selective reflector in an embodiment.

FIG. 6 shows a drawing illustrating the time-dependence of the center wavelength of a spectrum of light transmitted through the fiber Bragg grating 114 if a current pulse 304, 305 is applied to the semiconductor laser 101. A coordinate system 600 comprises a horizontal coordinate axis 601 representing time and a vertical coordinate axis 602 representing the center wavelength of the spectrum obtained at the respective point of time. A curve 603 schematically illustrates the center wavelength of the spectrum as a function of time.

At the beginning of a pulse 304, 305, the center wavelength 603 of the spectrum may exhibit an initial increase 605, as illustrated by reference numeral 605 in FIG. 6. Thereafter, the center wavelength may increase slower, as indicated by reference numeral 606. The duration of the initial increase 605 may be longer than the initial increase 405 obtained in the absence of the fiber Bragg grating 114. In some embodiments, the initial increase 605 may have a duration of about 20 nanoseconds corresponding to the time for locking. Moreover, the rate at which the center wavelength 603 increases after the initial increase 606 may be greater than the rate at which the center wavelength increases during the period of time indicated by reference numeral 406 in FIG. 4. Hence, during a current pulse 304, 305 applied to the semiconductor laser 101, a wavelength chirp may be obtained wherein the center wavelength of the spectrum of the light transmitted by the fiber Bragg grating 114 increases with time. If an electric current is applied to the semiconductor laser 101 for a relatively long time, the center wavelength of the spectrum transmitted by the fiber Bragg grating 114 may saturate at a substantially constant value. This regime is not shown in FIG. 6. The occurrence of the chirp has been attributed to a thermal wavelength shift in the semiconductor laser 101 and the saturation of the wavelength at long pulse times has been attributed to thermal settling.

Some embodiments may comprise determining a duration of the wavelength chirp. For this purpose, an electric current may be applied to the semiconductor laser 101, and the center wavelength of the spectrum of light transmitted by the fiber Bragg grating 114 can be measured in a time-resolved manner. Thereafter, a rate at which the center wavelength changes, which may comprise a derivative of the center wavelength with respect to time, may be compared to a threshold value. The duration of the chirp may be determined as the period of time between the point of time at which the electric current is switched on and the point of time at which the rate at which the center wavelength changes exceeds the threshold value for the first time.

In some embodiments, the threshold value can be determined on the basis of the gain bandwidth of stimulated Brillouin scattering and the build-up time of stimulated Brillouin scattering. In one embodiment, the threshold value may correspond to a ratio between the gain bandwidth of stimulated Brillouin scattering and the build-up time of stimulated Brillouin scattering. Hence, in case the stimulated Brillouin scattering gain bandwidth is about 100 megahertz at a wavelength of 1060 nanometers, and the build-up time of stimulated Brillouin scattering is about 10 nanoseconds, the threshold value may have a value in a range from about 4 picometers per 10 nanoseconds to about 40 picometers per 10 nanoseconds.

In the operation of the laser light source 100, a pulsed electric current may be supplied to the semiconductor laser 101, wherein the pulse time 306 of the pulsed electric current is selected on the basis of at least one of the duration of the wavelength chirp and the build-up time of a nonlinear optical effect, for example a build-up time of stimulated Brillouin scattering, in the first optical fiber 113. In one embodiment, the pulse time 306 may be equal to or less than a sum of the duration of the wavelength chirp and the build-up time of the nonlinear optical effect. In another embodiment, the pulse time may be equal to or less than the duration of the chirp.

As detailed above, the occurrence of nonlinear optical effects such as stimulated Brillouin scattering may be enhanced by the occurrence of a relatively high light density in a relatively narrow wavelength range for a period of time. During the wavelength chirp, the center wavelength of the spectrum of light transmitted through the fiber Bragg grating may change as a function of time, such that a period of time during which the first optical fiber 113 is exposed to a high intensity of light of a particular wavelength may be relatively short. Hence, the presence of the wavelength chirp may reduce a likelihood of stimulated Brillouin scattering or other undesirable nonlinear optical effects. Hence, the likelihood of undesirable nonlinear effects may be reduced by selecting a pulse time equal to the duration of the wavelength chirp or less. Selecting a pulse time shorter than the sum of the duration of the wavelength chirp and the build-up time of the nonlinear optical effect may also allow a reduction of the likelihood of the nonlinear optical effect occurring, since the time during which the first optical fiber 113 is exposed to light having a spectrum with a substantially constant center wavelength is shorter than the time required for the build-up of the nonlinear optical effect.

In some embodiments the duration of the chirp can be positively influenced by a specific type of pulse shape. As an example a slope on the pulse with rising amplitude may increase the rate at which the center wavelength shifts.

Figure 7A:
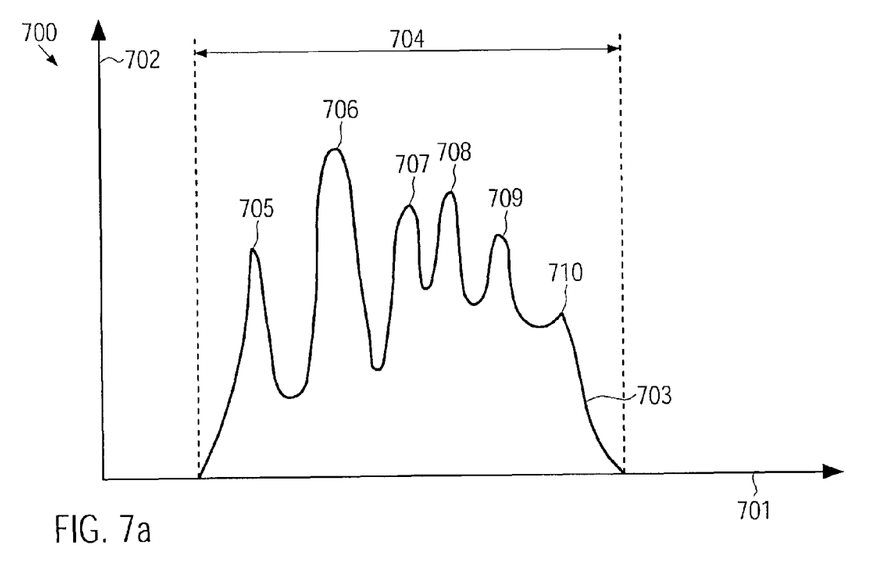
FIGS. 7a and 7b shows schematic drawings of a spectrum of light transmitted through a partially transmitting wavelength selective light reflector in a laser light source according to an embodiment.

FIG. 7a shows a schematic drawing illustrating a spectrum of light transmitted through the fiber Bragg grating 114 at a point of time 607 (FIG. 6) at the beginning of the pulse 304, 305 before the locking of the spectrum to the bandwidth of the fiber Bragg grating 114. A coordinate system 700 comprises a horizontal coordinate axis 701 representing a wavelength of the light and a vertical coordinate axis 702 representing an intensity of the light at the respective wavelength. A curve 703 schematically illustrates a measured spectrum of the light. The spectrum 703 may have a relatively large bandwidth 704 of about 6 nanometers or more, and may comprise a plurality of peaks 705-710, the wavelength of which may correspond to modes of the internal laser cavity 121.

Figure 7B:
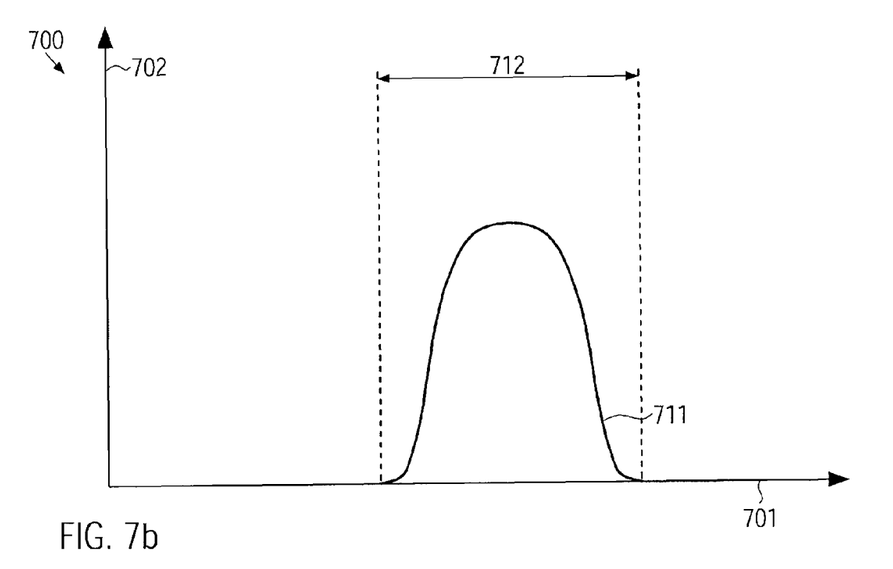

FIG. 7b shows a schematic drawing illustrating a spectrum 711 of light transmitted through the fiber Bragg grating 114 at a point of time 604 which is later than the point of time 607, wherein the spectrum 711 has locked to the bandwidth of the fiber Bragg grating 114. The spectrum 711 may have a bandwidth 712 which is smaller than the bandwidth 704 of the spectrum 703 obtained at the point of time 607, but may comprise a comparatively broad compound mode field consisting of modes of the internal laser cavity 119 and modes of the external laser cavity 120. Moreover, the intensity of the light may be relatively evenly distributed over the bandwidth of the fiber Bragg grating 114.

The external laser cavity 122 may be adapted such that the roundtrip time of light in the external laser cavity 122 is smaller than the build-up time for stimulated Brillouin scattering or, in other embodiments, another nonlinear optical effect, in the first optical fiber 113.

Hence, an interaction between the light reflected at the fiber Bragg grating 114, which may lead to locking of the spectrum emitted by the laser light source 100 to the bandwidth of the fiber Bragg grating 114 and a relatively even distribution of the intensity over the bandwidth of the fiber Bragg grating may be obtained before the nonlinear optical effect is occurring in the first optical fiber 113. Once the locking of the spectrum and the relatively even distribution of the light density are obtained, the likelihood of stimulated Brillouin scattering may be reduced compared to a laser light source wherein the output of the semiconductor laser 101 is directly coupled into the first optical fiber 113. Since the locking of the spectrum may be obtained before the build-up time for stimulated Brillouin scattering, a likelihood of an occurrence of stimulated Brillouin scattering may be reduced.

The roundtrip time of light in the external laser cavity 122 can be greater than a coherence time of the semiconductor laser 101. Thus, light reflected by the fiber Bragg grating 114 into the semiconductor laser 101 may act as a source of noise to modes of the internal laser cavity oscillating in the semiconductor laser 101, and generally, modes from the external cavity may contribute to spectral broadening. This may lead to a more efficient distribution of the spectrum of light transmitted through the fiber Bragg grating 114 over the bandwidth of the fiber Bragg grating 114.

The roundtrip time of light in the external laser cavity 122 and thereby also the number of modes of the external laser cavity 120 contributing to spectral broadening may be controlled by varying the length of the optical path of light in the external laser cavity 122, which can be done by varying the length of the external laser cavity 122, for example by varying the length of the portion of the second optical fiber 112 between the semiconductor laser 101 and the fiber Bragg grating 114. The roundtrip time of light in the external laser cavity 122 may be determined, for example, by dividing twice the length of the portion of the second optical fiber 112 between the semiconductor laser 101 and the fiber Bragg grating 114 by the speed of light in the second optical fiber 112.

In some embodiments, the time for locking of the spectrum of the light transmitted by the fiber Bragg grating 114 to the bandwidth of the fiber Bragg grating 114 may be determined, and the length of the optical path of light in the external laser resonator may be set up to adjust the time for locking to a value smaller than the build-up time for stimulated Brillouin scattering.

In some of these embodiments, the time for locking of the spectrum to the bandwidth of the fiber Bragg grating 114 can be determined by performing a temporally resolved measurement of the spectrum of the light transmitted through the fiber Bragg grating. The locking of the spectrum to the bandwidth of the fiber Bragg grating 114 can be identified by comparing the bandwidth of the spectrum with the bandwidth of the fiber Bragg grating 114. The bandwidth of the spectrum can be obtained by determining a wavelength range wherein an intensity greater than a predetermined threshold value is measured. In one embodiment, the spectrum may be assessed as stably locked if the bandwidth of the spectrum is equal to or less than the bandwidth of the fiber Bragg grating 114. In some embodiments, the time for locking may be measured for a plurality of distances between the semiconductor laser 101 and the fiber Bragg grating 114. Thereafter, a distance between the semiconductor laser 101 and the fiber Bragg grating 114 providing a locking time which is shorter than the build-up time of stimulated Brillouin scattering may be selected.

In other embodiments, the time for locking of the spectrum to the bandwidth of the fiber Bragg grating 114 can be determined by means of theoretical calculations. Models for an interaction between light and the active laser medium 104, and models of the propagation of light in the internal laser cavity 121 and the external laser cavity 122 are known to persons skilled in the art.

As detailed above, the full width half maximum bandwidth of the fiber Bragg grating 114 may be adapted to accommodate at least 250 longitudinal modes of the external laser cavity 122. According to equation (3), the spacing between the modes of the external laser cavity 122 may depend on the length of the optical path of light in the external laser cavity 122. Hence, if the length of the optical path in the external laser cavity 122 is reduced, for example by reducing the length of the portion of the second optical fiber 112 between the semiconductor laser 101 and the fiber Bragg grating 114, and the full width half maximum bandwidth of the fiber Bragg grating 114 is maintained, the number of longitudinal modes of the external laser cavity 122 accommodated by the full width half maximum bandwidth of the fiber Bragg grating may reduced. Hence, in embodiments wherein a relatively short optical path in the external laser cavity 122 is provided, the fiber Bragg grating 114 may have a relatively large full width half maximum bandwidth to accommodate a desired number of longitudinal modes of the external laser cavity 122. Conversely, in embodiments wherein a relatively long optical path in the external laser cavity 122 is provided, the fiber Bragg grating may have a relatively narrow full width half maximum bandwidth.

In some embodiments, the fiber Bragg grating 114 may have a full width half maximum bandwidth of about 0.5 nanometers or more, a full width half maximum bandwidth in a range from about 0.5 nanometers to about 5 nanometers and/or a full width half maximum bandwidth of about 2 nanometers. The external laser cavity 122 can be adapted such that a roundtrip time of light in the external laser cavity 122 has a value of about 20 nanoseconds or less, a value of about 10 nanoseconds or less, a value of about 5 nanoseconds or less and/or a value of about 1 nanosecond or less. A length of the portion of the second optical fiber between the semiconductor laser 101 and the fiber Bragg grating can have a value in a range from about 10 centimeters to about 2 meters, a value in a range from about 10 centimeters to about 1 meter, a value in a range from about 10 centimeters to about 50 centimeters, a value in a range from about 20 centimeters to about 50 centimeters, a value of about 25 centimeters and/or a value of about 75 centimeters.

Figure 8:
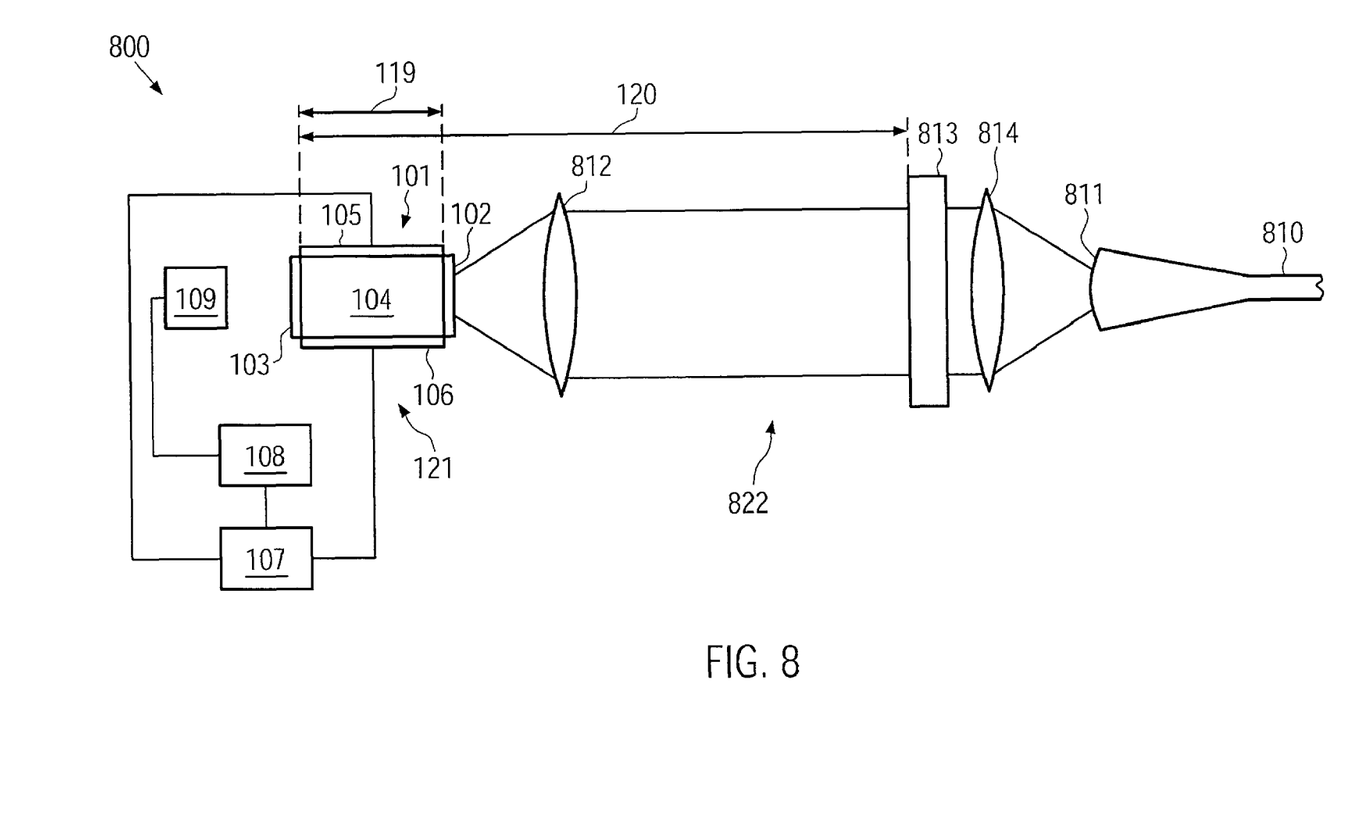
FIG. 8 shows a schematic drawing of a laser light source according to another embodiment of the present invention.

FIG. 8 shows a schematic drawing of a laser light source 800 according to another embodiment of the present invention. For convenience, in FIGS. 1 and 8, like reference numerals are used to denote like components. Unless indicated otherwise in the following, features of the laser light source 800 may correspond to those of the laser light source 100 described above with reference to FIG. 1, and methods of forming and operating the laser light source 800 may correspond to methods of forming and operating the laser light source 100.

The laser light source 800 comprises a semiconductor laser 101 having a front facet 102 and a back facet 103 defining an internal laser cavity 121 having a length 119, a laser active medium 104 and electrodes 105, 106 connected to a power source 107, the operation of which may be controlled by a control unit 108. A light sensor 109 can be provided adjacent the back facet 103 of the semiconductor laser 101 for measuring an intensity of light transmitted through the back facet 103. The light sensor 109 can be connected to the control unit 108, and an output of the light sensor 109 can be used by the control unit 108 to control at least one of a voltage and an amperage of an electric current supplied to the semiconductor laser 101.

The laser light source 800 may further comprise a partially transmitting wavelength selective light reflector 813 which is arranged such that the back facet 103 of the semiconductor laser 101 and the wavelength selective light reflector form an external laser cavity 822. The wavelength selective light reflector 813 can be provided at a distance 120 from the back facet of the semiconductor laser 101. Hence, a length of an optical path of light in the external laser resonator may be approximately equal to the distance 120.

A lens 812 can be provided between the semiconductor laser 101 and the wavelength selective light reflector 813 to collimate light emitted by the semiconductor laser 101, and to focus light reflected by the wavelength-selective light reflector 813 into the semiconductor laser 101.

The laser light source 800 can further comprise an optical fiber 810 arranged to receive light transmitted by the wavelength selective light reflector 813. A lens 814 can be provided between the wavelength selective light reflector 813 and the optical fiber 810 to focus the light transmitted by the wavelength selective light reflector 813 into the optical fiber 810. Additionally, or alternative thereto, the optical fiber 810 may comprise an end having a lens-shaped surface 811. The lens 814 and/or the lens-shaped surface 812 may help to improve an efficiency of a coupling of light transmitted by the wavelength selective light reflector 813 into the optical fiber 810.

Features of the optical fiber 810 may be similar to those of the first optical fiber 115 in the laser light source 100 shown in FIG. 1. In some embodiments, the optical fiber 810 can comprise an optical fiber amplifier similar to the optical fiber amplifier 115. In such embodiments, the laser light source 800 may further comprise a pump light source similar to the pump light source 116, a coupling element 118 for coupling light emitted by the pump light source into the optical fiber 810 and an optical fiber similar to the optical fiber 117 connecting the pump light source and the coupling element.

In some embodiments, the wavelength selective light reflector 813 can comprise a dichroic mirror of a type known to persons skilled in the art. As persons skilled in the art know, dichroic mirrors operate using the principle of interference. Alternating layers of an optical coating are built up upon a glass substrate, selectively reinforcing certain wavelengths of light and interfering with other wavelengths. The layers can be deposited using a deposition process carried out in a vacuum. By controlling the thickness and number of the layers, the dichroic mirror can be adapted to reflect light within a wavelength range, and to substantially completely transmit light having a wavelength outside the wavelength range. The present invention, however, is not restricted to embodiments wherein the wavelength selective light reflector 813 comprises a dichroic mirror. In other embodiments, the wavelength selective light reflector 831 can comprise a partially transmitting diffraction grating arranged in Littrow configuration such that light within a desired wavelength range is partially reflected towards the semiconductor laser.

A reflectivity and a full width half maximum bandwidth of the partially transmitting wavelength selective light reflector 813 may correspond to those of the fiber Bragg grating 114 (FIG. 1) described above. Hence, in the laser light source 800, a locking of the spectrum of light transmitted by the wavelength selective reflector 813 to the bandwidth of the wavelength selective light reflector 813, a relatively even distribution of light intensity over the bandwidth of the wavelength selective light reflector 813 and a wavelength chirp can be obtained, similar to the laser light source 100. Advantageously, in the laser light source 800, the roundtrip time of light in the external laser cavity 822 may be changed in a convenient manner during the operation of the laser light source 800 by varying the distance between the wavelength selective light reflector 813 and the semiconductor laser 101. Hence, the laser light source 800 can be adapted to the requirements of the particular application in a flexible manner.

In one embodiment, the laser light source 100 (FIG. 1) and/or the laser light source 800 (FIG. 8) can be used in laser machining applications wherein light created by the laser light source 100, 800 may be directed to a workpiece, optionally after amplification in an optical fiber amplifier such as the optical fiber amplifier 115 described above with reference to FIG. 1, to perform at least one of laser welding of the workpiece, laser marking of the workpiece and laser cutting of the workpiece.

Further modifications and variations of the present invention will be apparent to those skilled in the art in view of this description. Accordingly, this description is to be construed as illustrative only and is for the purpose of teaching those skilled in the art the general manner of carrying out the present invention. It is to be understood that the forms of the invention shown and described herein are to be taken as the presently preferred embodiments.

The invention claimed is:

1. A laser light source, comprising:
   a semiconductor laser adapted for pulsed operation and comprising a front reflective element and a back reflective element, said front reflective element and said back reflective element defining an internal laser cavity, said internal laser cavity comprising a laser active medium;
   a power source configured to supply a pulsed electric current to said semiconductor laser, wherein said power source is adapted to supply said pulsed electric current with a pulse duration in a range from about 3 nanoseconds to about 1 microsecond, and wherein the pulsed electric current has a duty cycle of 10% or less; and
   a partially transmitting wavelength selective light reflector having a peak reflectivity within a gain bandwidth of said laser active medium, said wavelength selective light reflector and said back reflective element defining an external laser cavity, wherein a roundtrip time of light in said external laser cavity is about 20 nanoseconds or less; and
   wherein a full width half maximum bandwidth of said wavelength selective light reflector is adapted to accommodate at least 5 longitudinal modes of the internal laser cavity and at least 20 longitudinal modes of the external laser cavity.

2. A laser light source as in claim 1, further comprising an optical fiber arranged to receive light emitted by said semiconductor laser, wherein said wavelength-selective light reflector comprises a fiber Bragg grating formed in said optical fiber.

3. A laser light source as in claim 1, wherein said roundtrip time of light in said external laser cavity is less than at least one of about 10 nanoseconds, about 5 nanoseconds and about 1 nanosecond.

4. A laser light source as in claim 1, wherein said full width half maximum bandwidth of said wavelength-selective light reflector is adapted to accommodate at least 25 longitudinal modes of said internal laser cavity and at least 250 longitudinal modes of said external laser cavity.

5. A laser light source as in claim 1, wherein a reflectivity of said front reflective element is equal to or greater than at least one of about 0.01% and about 0.1%.

6. A laser light source as in claim 1, wherein a reflectivity of said front reflective element is equal to or less than at least one of about 0.01% and about 1%.

7. A laser light source as in claim 1, wherein said semiconductor laser is adapted to emit light having a coherence time which is smaller than said roundtrip time of light in said external laser cavity.

8. A laser light source as in claim 1, wherein said pulse duration is in a range from about 5 nanoseconds to about 500 nanoseconds.

9. A laser light source, comprising:
   a semiconductor laser adapted for pulsed operation and comprising a front reflective element and a back reflective element, said front reflective element and said back reflective element defining an internal laser cavity, said internal laser cavity comprising a laser active medium;
   a power source configured to supply a pulsed electric current to said semiconductor laser, wherein said power source is adapted to supply said pulsed electric current with a pulse duration in a range from about 3 nanoseconds to about 1 microsecond, and wherein the pulsed electric current has a duty cycle of 10% or less;
a partially transmitting wavelength selective light reflector having a peak reflectivity within a gain bandwidth of said laser active medium, said wavelength-selective light reflector and said back reflective element defining an external laser cavity; and
an optical fiber amplifier arranged to receive light transmitted by said wavelength-selective light reflector, said optical fiber amplifier having a build-up time for a nonlinear optical effect;
wherein said external laser cavity is configured to provide a roundtrip time of light in said external laser cavity which is shorter than said build-up time of said nonlinear optical effect; and
wherein a full width half maximum bandwidth of said wavelength selective light reflector is adapted to accommodate at least 5 longitudinal modes of the internal laser cavity and at least 20 longitudinal modes of the external laser cavity.

10. A laser light source as in claim 9, wherein said nonlinear optical effect comprises stimulated Brillouin scattering.

11. A laser light source as in claim 9, further comprising an optical fiber connecting said semiconductor laser and said optical fiber amplifier, wherein said wavelength selective light reflector comprises a fiber Bragg grating formed in said optical fiber.

* * * * *